United States Patent [19]
Kikuchi

[11] Patent Number: 6,167,096
[45] Date of Patent: Dec. 26, 2000

[54] TRANSMITTING CIRCUIT FOR USE IN CODE-DIVISION MULTIPLE ACCESS SYSTEM AND FREQUENCY-DIVISION MULTIPLE ACCESS SYSTEM

[75] Inventor: Jiro Kikuchi, Fukushima-ken, Japan

[73] Assignee: Alps Electric Co., Ltd., Tokyo, Japan

[21] Appl. No.: 09/334,883

[22] Filed: Jun. 17, 1999

[30] Foreign Application Priority Data

Jun. 23, 1998 [JP] Japan .................................. 10-175647

[51] Int. Cl.⁷ .................................................. H04L 27/20
[52] U.S. Cl. .......................... 375/308; 375/302; 375/376
[58] Field of Search .................................. 375/308, 376; 332/103, 127

[56] References Cited

U.S. PATENT DOCUMENTS 5,434,887 7/1995 Osaka ...................................... 375/295

FOREIGN PATENT DOCUMENTS 8-139618 5/1996 Japan .
8-162980 6/1996 Japan .

*Primary Examiner*—Don N. Vo
*Assistant Examiner*—Phuong Phu
*Attorney, Agent, or Firm*—Brinks, Hofer, Gilson & Lione

[57] ABSTRACT

A transmitting circuit comprises a QPSK modulator, a voltage controlled oscillator used as a frequency modulator, and a PLL circuit for controlling the oscillation frequency of the voltage controlled oscillator. The frequency of a reference signal supplied to the PLL circuit is used as a first reference frequency in the event of performing the QPSK modulation by the QPSK modulator and is used as a second reference frequency lower than the first reference frequency in the event of performing the frequency modulation by the voltage controlled oscillator.

4 Claims, 2 Drawing Sheets

6,167,096

TRANSMITTING CIRCUIT FOR USE IN CODE-DIVISION MULTIPLE ACCESS SYSTEM AND FREQUENCY-DIVISION MULTIPLE ACCESS SYSTEM

BACKGROUND OF THE INVENTION

1. Field of the Invention

The present invention relates to a transmitting circuit of a portable telephone or the like as a mobile telephone and, more particularly, to a transmitting circuit of what is called a dual mode mobile telephone which is used in both of the CDMA (Code Division Multiple Access) system and the FDMA (Frequency Division Multiple Access) system.

2. Description of the Related Art

A conventional transmitting circuit comprises, as a part of the construction is illustrated in FIG. 3, a QPSK modulator 51, a voltage controlled oscillator 61, and a PLL circuit 71. The QPSK modulator 51 is used at the time of transmission in the CDMA system. An oscillation signal is supplied from the voltage controlled oscillator 61 to the QPSK modulator 51. The voltage controlled oscillator 61 is used as a frequency modulator in the FDMA system. In both of the CDMA system and the FDMA system, the oscillation frequency of the voltage controlled oscillator 61 is controlled by the PLL circuit 71.

The QPSK modulator 51 has two mixers 52 and 53 and an adder 54. One (I signal) of baseband signals as modulation signals is supplied to the mixer 52. Similarly, the other baseband signal (Q signal) as a modulation signal is supplied to the other mixer 53. An oscillation signal from the voltage controlled oscillator 61 is switched by a change-over switch 55 to either the mixers 52 and 53 or the adder 54. In this case, since the oscillation signal is supplied to the mixer 53 via a phase shifter 56, the phases of the oscillation signals supplied to the mixers 52 and 53 are different from each other at 90 degrees.

The PLL circuit 71 has a variable frequency divider 72 for dividing the frequency of the oscillation signal outputted from the voltage controlled oscillator 61, a phase comparator 73 to which the frequency-divided oscillation signal is supplied, a lowpass filter 74 for smoothing an error signal outputted from the phase comparator 73, and a reference oscillator 75 for outputting a reference signal to the phase comparator 73. A control voltage is supplied from the low pass filter 74 to the voltage controlled oscillator 61. Channel data from a communication channel setting circuit 76 is supplied to the variable frequency divider 72 and the frequency of the oscillation signal of the voltage controlled oscillator 61 is set. A voice signal A as a modulation signal is supplied to the voltage controlled oscillator 61.

When the above construction is used in the CDMA system, a modulation signal is supplied to the mixers 52 and 53 and the oscillation signal from the voltage controlled oscillator 61 is switched to the mixers 52 and 53 by the change-over switch 55. In this case, a modulation signal for frequency modulation is not supplied to the voltage controlled oscillator 61. The oscillation signal is subjected to the QPSK modulation. The resultant signal is outputted to an amplifier 57 via the adder 54, subjected to the frequency conversion by a mixer (not shown), and outputted to an antenna. The oscillation frequency of the voltage controlled oscillator 61 at this time is about 260 MHz. Since the frequency band of the baseband signal as a modulation signal is about 600 kHz, the frequency of a reference signal to be supplied to the phase comparator 73 in the PLL circuit 71 is set to 1.23 MHz which is about twice as high as 600 kHz, thereby avoiding interference with the baseband signal. The frequency dividing ratio of the variable frequency divider 72 is therefore set to approximately 217.

On the other hand, when the construction is used in the FDMA system, the baseband signal is not supplied to the mixers 52 and 53 in the QPSK modulator 51 but a modulation signal is supplied to the voltage controlled oscillator 61. The voltage controlled oscillator 61 operates as a frequency modulator in this case. Similarly, the oscillation frequency of the voltage controlled oscillator 61 is controlled by the PLL circuit 71.

Specifically, a reference signal having a frequency of 1.23 MHz from the reference oscillator 75 is supplied to the phase comparator 73 and is oscillated by the voltage controlled oscillator 61 at a frequency determined by the frequency dividing ratio of the variable frequency divider 72. A modulated signal is outputted from the voltage controlled oscillator 61 and is supplied via the change-over switch 55 to the adder 54. The adder 54 outputs the modulated signal as it is to the amplifier 57. The amplified modulated signal is similarly subjected to the frequency conversion and a resultant signal is outputted to the antenna.

In a conventional transmitting circuit, however, in order to avoid interference with the baseband signal, the frequency of the reference signal supplied to the phase comparator 73 in the PLL circuit 71 is set to a value which is about twice as high as 600 kHz that is the highest limit of the frequency components of the baseband signal. Consequently, when the voltage controlled oscillator 61 is used as a frequency modulator, that is, it is used in the FDMA system, the loop sensitivity becomes too high. As shown in FIG. 4, therefore, a problem such that a frequency deviation in the region where the frequency of the modulation signal is equal to or lower than 500 Hz abruptly decreases occurs.

SUMMARY OF THE INVENTION

It is an object of the invention to provide a transmitting circuit, in case of performing frequency modulation, which can have a flat frequency deviation also in a range where the modulation frequency is low by lowering the frequency of a reference signal supplied to the phase comparator 73 in the PLL circuit to thereby decrease the loop sensitivity of the PLL circuit 71.

As means for solving the problem, according to the invention, there is provided a transmitting circuit comprising a QPSK modulator, a voltage controlled oscillator, and a PLL circuit for controlling an oscillation frequency of the voltage controlled oscillator, wherein the voltage controlled oscillator is used as a frequency modulator or a local oscillator for supplying a local oscillation signal to the QPSK modulator, the PLL circuit has a first variable frequency divider for dividing the frequency of the oscillation signal of the voltage controlled oscillator, a phase comparator to which the oscillation signal which is frequency divided by the first variable frequency divider and a reference signal are supplied and which outputs an error signal, and a low pass filter for smoothing the error signal and supplying the smoothed voltage to the voltage controlled oscillator, a first modulation signal is supplied to the QPSK modulator, a second modulation signal having a frequency lower than the highest frequency of the first modulation signal is supplied to the voltage controlled oscillator, the frequency of the reference signal is used as a first reference frequency in the event of performing QPSK modulation by the QPSK modulator, and the frequency of the reference signal is used as a second reference frequency which is lower than the first reference frequency in the event of performing frequency modulation by the voltage controlled oscillator.

According to the transmitting circuit of the invention, the first reference frequency is set to be about twice as high as the frequency of the first modulation signal or higher and the second reference frequency is set to be about twice as high as the frequency of the second modulation signal or higher.

According to the transmitting circuit of the invention, the first modulation signal is a digital signal obtained by digitizing a voice signal or the like, the second modulation signal is a voice signal, the first reference frequency is set at 1.23 MHz and the second reference frequency is set at 60 kHz.

According to the transmitting circuit of the invention, a reference oscillator having a fixed oscillation frequency and a second variable frequency divider for dividing the frequency of a reference oscillation signal outputted from the reference oscillator are provided, and the reference signal is outputted from the second variable frequency divider.

DETAILED DESCRIPTION OF THE PREFERRED EMBODIMENT

Figure 1:
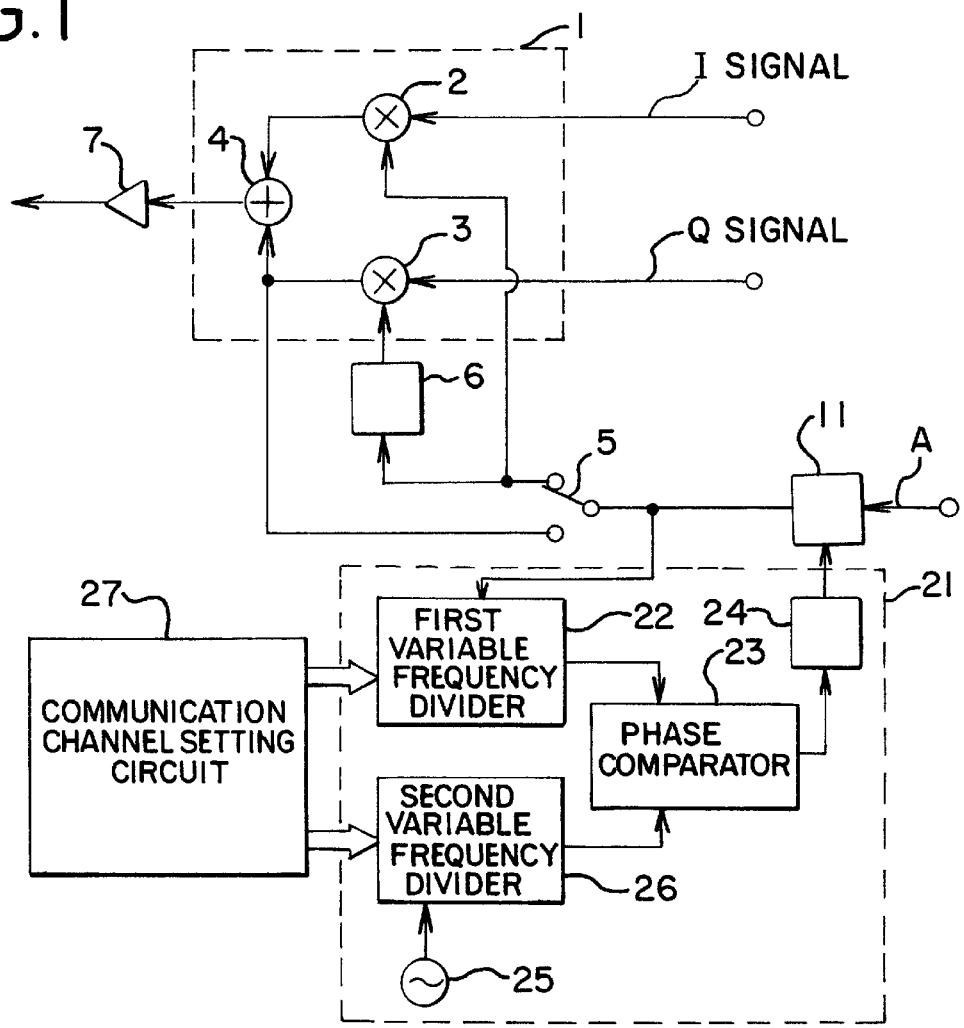
FIG. 1 is a circuit diagram showing the construction of a transmitting circuit of the invention.

A transmitting circuit of the invention comprises, as the construction of a part of the circuit is shown in FIG. 1, a QPSK modulator 1, a voltage controlled oscillator 11, and a PLL circuit 21. The QPSK modulator 1 is used at the time of transmission in the CDMA system and receives an oscillation signal from the voltage controlled oscillator 11. The voltage controlled oscillator 11 is also used as the frequency modulator in the FDMA system. In any of the CDMA system and the FDMA system, the oscillation frequency of the voltage controlled oscillator 11 is controlled by the PLL circuit 21.

The QPSK modulator 1 has two mixers 2 and 3 and an adder 4. Baseband signals as first modulation signals are supplied to the QPSK modulator 1. One (I signal) of the baseband signals is supplied to the mixer 2 and, similarly, the other baseband signal (Q signal) is supplied to the other mixer 3. Each of the baseband signals is a digital signal obtained by digitizing a voice signal or a data signal. The frequency components of the signal are therefore distributed from about 1 kHz to 600 kHz. The oscillation signal from the voltage controlled oscillator 11 is switched by a change-over switch 5 to either the mixers 2 and 3 or the adder 4. Since the oscillation signal is supplied via a phase shifter 6 to the other mixer 3, the phases of the oscillation signals supplied to the mixers 2 and 3 are different from each other at 90 degrees.

A PLL circuit 21 comprises a first variable frequency divider 22 for dividing the frequency of the oscillation signal outputted from the voltage controlled oscillator 11, a phase comparator 23 to which the frequency-divided oscillation signal is supplied, a low pass filter 24 for smoothing an error signal outputted from the phase comparator 23, a reference oscillator 25 for outputting an oscillation signal whose frequency is fixed, and a second variable frequency divider 26 for dividing the frequency of the oscillation signal from the reference oscillator 25 and supplying the resultant signal as a reference signal to the phase comparator 23. A control voltage is supplied from the low pass filter 24 to the voltage controlled oscillator 11. Channel data from a communication channel setting circuit 27 is supplied to both of the first variable frequency divider 22 and the second variable frequency divider 26 and the frequency of the oscillation signal of the voltage controlled oscillator 11 is set. A voice signal (A) as a second modulation signal is supplied to the voltage controlled oscillator 11.

When the construction is used in the CDMA system, the modulation signals are supplied to the mixers 2 and 3 and the oscillation signal from the voltage controlled oscillator 11 is also supplied via the change-over switch 5 to the mixers 2 and 3. At this time, the modulation signal (A) for frequency modulation is not supplied to the voltage controlled oscillator 11. The oscillation signal is QPSK modulated, the resultant signal is outputted via the adder 4 to the amplifier 7 and is frequency converted by a mixer (not shown), and the frequency converted signal is outputted to an antenna. Since the oscillation frequency of the voltage controlled oscillator 11 at this time is approximately 260 MHz and the upper limit (highest frequency) of the frequency components of the baseband signals (I signal and Q signal) as modulation signals is about 600 kHz, the frequency of a reference signal supplied to the phase comparator 23 in the PLL circuit 21 is set to 1.23 MHz which is about twice as high as 600 kHz, thereby avoiding interference with the baseband signals. The frequency dividing ratio of the variable frequency divider 72 is therefore set to about 217.

On the other hand, when the construction is used in the FDMA system, the baseband signal is not supplied to the mixers 2 and 3 in the QPSK modulator 1 but the modulation signal is supplied to the voltage controlled oscillator 11. At this time, consequently, the voltage controlled oscillator 11 operates as a frequency modulator. The oscillation frequency of the voltage controlled oscillator 11 is similarly controlled by the PLL circuit 21.

The frequency of the reference signal supplied to the phase comparator 23 in the PLL circuit 21 is set to be a low value of about 60 kHz, different from 1.23 MHz in the case of the CDMA system. The frequency (60 kHz) is twice as high as the highest frequency (about 15 kHz) of the second modulation signal or higher.

Specifically, the frequency of the reference signal from the reference oscillator 25 is divided by the second variable frequency divider 26 in accordance with channel data of the communication channel setting circuit 27. The resultant signal having the frequency of 60 kHz is supplied to the phase comparator 23. The voltage controlled oscillator 11 oscillates at a frequency determined by the frequency dividing ratio of the first variable frequency divider 22. In this case, since the reference frequency is low, the frequency dividing ratio of the first variable frequency divider 22 becomes high and the loop sensitivity of the PLL circuit 21 decreases. A frequency modulated signal is outputted from the voltage controlled oscillator 11 and is supplied via the change-over switch 5 to the adder 4. The adder 4 outputs the modulated signal as it is to the amplifier 7. The amplified modulated signal is similarly subjected to the frequency conversion and the resultant signal is outputted to an antenna.

Figure 2:
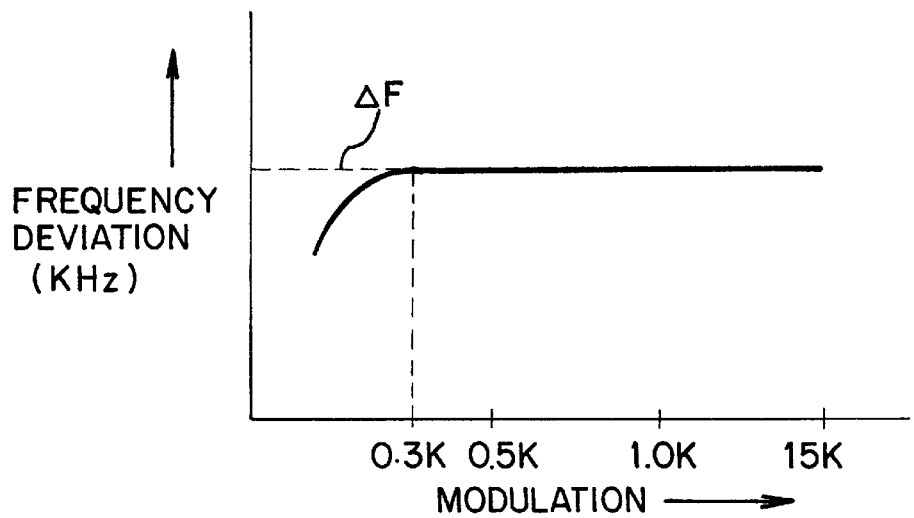
FIG. 2 is a modulation characteristic diagram showing characteristics of the degree of modulation of the transmitting circuit of the invention.
Figure 3:
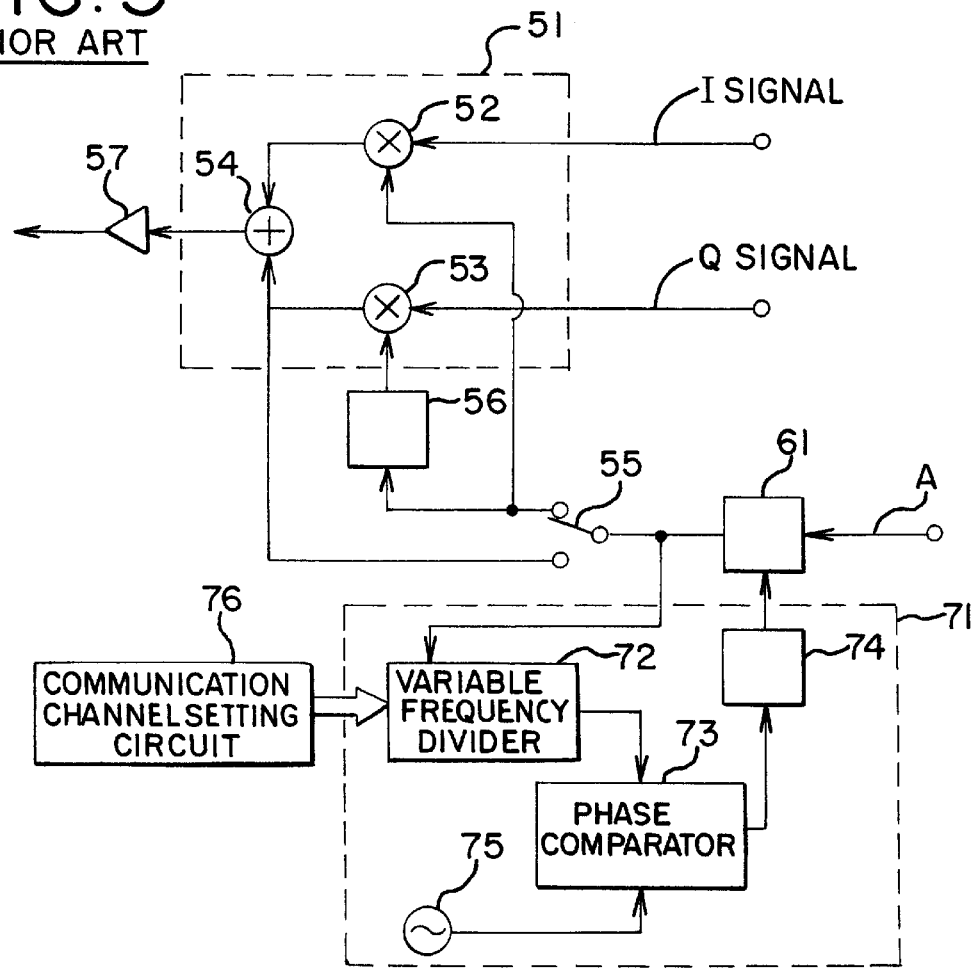
FIG. 3 is a circuit diagram showing the construction of a conventional transmitting circuit.
Figure 4:
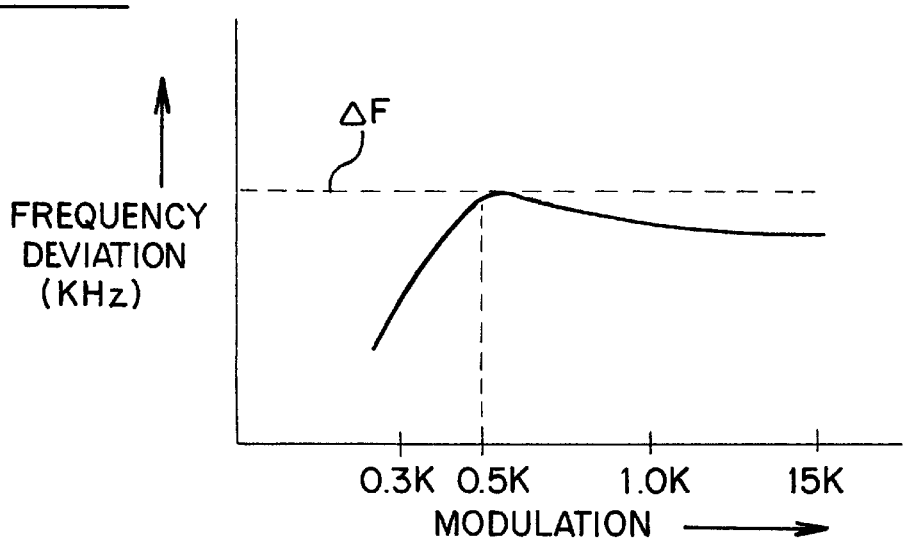
FIG. 4 is a modulation characteristic diagram showing characteristics of the degree of modulation of the conventional transmitting circuit.

Since the frequency of the reference signal is set to be a low value of 60 kHz at the time of the frequency modulation, the frequency dividing ratio of the first variable frequency divider 22 becomes higher by twenty times and the loop sensitivity of the PLL circuit 21 decreases. As illustrated in FIG. 2, a frequency deviation ΔF such that the frequency of the second modulation signal is almost flat until 300 Hz or lower can be obtained. Although the specification of the frequency deviation ΔF differs according to a system, it is about 8 kHz.

The reference frequency in the event of frequency modulation is set to 60 kHz in order to avoid interference with the second modulation signal and to lower the loop sensitivity of the PLL circuit 21 as much as possible by setting the reference frequency to the highest limit (about 15 kHz) of the frequency of the voice signal as a second modulation signal or higher.

As described above, the transmitting circuit of the invention comprises the QPSK modulator, the voltage controlled oscillator used as a frequency modulator, and the PLL circuit for controlling the oscillation frequency of the voltage controlled oscillator. The frequency of the reference signal supplied to the PLL circuit is used as a first reference frequency in the event of performing QPSK modulation by the QPSK modulator, and the frequency of the reference signal is used as a second reference frequency which is lower than the first reference frequency in the event of performing frequency modulation by the voltage controlled oscillator. At the time of the frequency modulation, therefore, the loop sensitivity of the PLL circuit can be reduced and the frequency deviation can be made flat also in a range where the frequency of the modulation signal is low.

According to the transmitting circuit of the invention, the first reference frequency is set to be about twice as high as the frequency of the first modulation signal and the second reference frequency is set to be about twice as high as the frequency of the second modulation signal. In both of the QPSK modulation and the frequency modulation, the reference signal does not interfere with the modulation signal.

In the transmitting circuit of the invention, the first modulation signal is a digital signal obtained by digitizing a voice signal or the like, the second modulation signal is a voice signal, the first reference frequency is set at 1.23 MHz and the second reference frequency is set at 60 kHz. There is consequently no interference with both of the baseband signal as the first modulation signal and the voice signal as the second modulation signal, the loop sensitivity upon frequency modulation can be also reduced, and the frequency deviation in the frequency modulation is not decreased even in the case of the voice signal having a low frequency.

The transmitting circuit of the invention is provided with the reference oscillator having a fixed oscillation frequency and the second variable frequency divider for dividing the frequency of the reference oscillation signal outputted from the reference oscillator, and the reference signal is outputted from the second variable frequency divider. The first and second reference frequencies can be, therefore, easily set by changing the frequency dividing ratio of the second variable frequency divider.

What is claimed is:

1. A transmitting circuit for a code-division multiple access system and a frequency-division multiple access system, said transmitting circuit comprising: a QPSK modulator, a voltage controlled oscillator, and a PLL circuit for controlling an oscillator frequency of the voltage controlled oscillator, wherein the PLL circuit includes: a circuit for generating at least a first reference signal and a second reference signal, a first variable frequency divider dividing the frequency of an oscillation signal of the voltage controlled oscillator, a phase comparator to which the oscillation signal which is frequency divided by the first variable frequency divider and a reference signal are supplied and that outputs an error signal, and a low pass filter for smoothing the error signal and supplying the smoothed error signal to the voltage controlled oscillator, the voltage controlled oscillator supplying the oscillation signal to the QPSK modulator when performing QSPK modulation by the QSPK modulator when a first modulation signal is supplied to the QPSK modulator, and said first reference signal is supplied to said phase comparator, and the voltage controlled oscillator is performing frequency modulation when a second modulation signal having a frequency lower than the highest frequency of the first modulation signal is supplied to the voltage controlled oscillator, and when said second reference signal is supplied to said phase comparator, the second reference signal having a frequency which is lower than the frequency of the first reference signal.

2. The transmitting circuit of claim 1, wherein the frequency of the first reference signal is set to be about twice as high as the highest frequency of the first modulation signal or higher, the frequency of the second reference signal is set to be about twice as high as the highest frequency of the second modulation signal or higher, and the frequency of the second reference signal is set to be lower than the frequency of the first reference signal.

3. The transmitting circuit of claim 2, wherein the first modulation signal is a digital signal obtained by digitizing a voice signal, the second modulation signal is a voice signal, the frequency of the first reference signal is set at 1.23 MHz and the frequency of the second reference signal is set at 60 kHz.

4. The transmitting circuit of claim 1, wherein the circuit for generating at least a first and a second reference signals includes: a reference oscillator having a fixed oscillation frequency and a second variable frequency divider for dividing the frequency of a reference oscillation signal outputted from the reference oscillator, and the reference signals are outputted from the second variable frequency divider.

* * * * *